US012096676B2

(12) United States Patent
Fan et al.

(10) Patent No.: US 12,096,676 B2
(45) Date of Patent: Sep. 17, 2024

(54) DISPLAY SUBSTRATE, METHOD OF FORMING DISPLAY SUBSTRATE AND DISPLAY DEVICE (71) Applicant: BOE Technology Group Co., Ltd., Beijing (CN)

(72) Inventors: Xing Fan, Beijing (CN); Chao Kong, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 250 days.

(21) Appl. No.: 17/552,334

(22) Filed: Dec. 15, 2021

(65) Prior Publication Data
US 2022/0271105 A1 Aug. 25, 2022

(30) Foreign Application Priority Data
Feb. 19, 2021 (CN) .......................... 202110192306.1

(51) Int. Cl.
H01L 27/32 (2006.01)
G02F 1/155 (2006.01)
(Continued)

(52) U.S. Cl.
CPC ............. *H10K 59/50* (2023.02); *G02F 1/155* (2013.01); *G02F 1/157* (2013.01); *H10K 50/81* (2023.02);
(Continued)

(58) Field of Classification Search
CPC ...... H10K 50/86; H10K 50/865; H10K 59/50; H10K 59/8791; H10K 59/8792;
(Continued)

(56) References Cited

U.S. PATENT DOCUMENTS

2018/0342563 A1 11/2018 You et al.
2020/0035951 A1 1/2020 Cheon et al.
(Continued)

FOREIGN PATENT DOCUMENTS

CN 106098737 A * 11/2016 ............. H10K 59/50
CN 107104130 A 8/2017
(Continued)

OTHER PUBLICATIONS

Machine translation, Yang, Chinese Pat. Pub. No. CN113725270A, translation date: Dec. 30, 2023, Espacenet, all pages. (Year: 2023).*
(Continued)

Primary Examiner — Victoria K. Hall
(74) Attorney, Agent, or Firm — IPro, PLLC (57) ABSTRACT A display substrate, a method of forming a display substrate and a display device are provided. The display substrate includes: a plurality of pixel units arranged in an array, a substrate, a light-emitting device layer and an electrochromic functional layer, where the light-emitting device layer and the electrochromic functional layer are stacked on the substrate; the light-emitting device layer includes a plurality of light-emitting devices, an orthographic projection of the electrochromic functional device on the substrate is at least partially overlapped with an orthographic projection of the corresponding effective light-emitting area on the substrate.

15 Claims, 4 Drawing Sheets (51) Int. Cl.

| | |
|---|---|
| *G02F 1/157* | (2006.01) |
| *H01L 51/52* | (2006.01) |
| *H01L 51/56* | (2006.01) |
| *H10K 50/81* | (2023.01) |
| *H10K 59/50* | (2023.01) |
| *H10K 71/00* | (2023.01) |
| *G02F 1/1516* | (2019.01) |
| *G02F 1/1524* | (2019.01) |
| *H10K 59/12* | (2023.01) |
| *H10K 59/123* | (2023.01) |
| *H10K 59/124* | (2023.01) |

(52) U.S. Cl.
CPC ........... *H10K 71/00* (2023.02); *G02F 1/1516* (2019.01); *G02F 1/1524* (2019.01); *H10K 59/1201* (2023.02); *H10K 59/123* (2023.02); *H10K 59/124* (2023.02)

(58) Field of Classification Search
CPC .. G09G 3/3208; G09G 3/38; G09G 2300/046; G02F 2201/44
See application file for complete search history.

(56) References Cited

U.S. PATENT DOCUMENTS

| | | | |
|---|---|---|---|
| 2020/0251538 A1* | 8/2020 | Zhang | .................. G02F 1/0126 |
| 2020/0258955 A1* | 8/2020 | Wang | ..................... H10K 50/84 |
| 2020/0319521 A1 | 10/2020 | Qin et al. | |

FOREIGN PATENT DOCUMENTS

| | | | | |
|---|---|---|---|---|
| CN | 107425043 A | * | 12/2017 | ............. H10K 50/00 |
| CN | 108987451 A | * | 12/2018 | ............. G02F 1/153 |
| CN | 109728205 A | | 5/2019 | |
| CN | 110676300 A | | 1/2020 | |
| CN | 110783480 A | | 2/2020 | |
| CN | 111192904 A | | 5/2020 | |
| CN | 111554822 A | | 8/2020 | |
| CN | 113130607 A | * | 7/2021 | ............. H10K 59/50 |
| CN | 113725270 A | * | 11/2021 | ............. H10K 59/50 |

OTHER PUBLICATIONS

Machine translation, Li, Chinese Pat. Pub. No. CN113130607A, translation date: Dec. 30, 2023, Espacenet, all pages. (Year: 2023).*
Machine translation, Jia, Chinese Pat. Pub. No. CN107425043A, translation date: Dec. 27, 2023, Espacenet, all pages. (Year: 2023).*
Machine translation, Zhang, Chinese Pat. Pub. No. CN113725270A, translation date: Dec. 27, 2023, Espacenet, all pages. (Year: 2023).*
Machine translation, Fang, Chinese Pat. Pub. No. CN108987451A, translation date: Dec. 27, 2023, Espacenet, all pages. (Year: 2023).*
CN 202110192306.1 first office action, issued Mar. 9, 2022.

* cited by examiner

FIG.7

DISPLAY SUBSTRATE, METHOD OF FORMING DISPLAY SUBSTRATE AND DISPLAY DEVICE

CROSS-REFERENCE TO RELATED APPLICATIONS

This application claims priority to Chinese Patent Application No. 202110192306.1 filed in China on Feb. 19, 2021, the entire contents of which are incorporated herein by reference.

TECHNICAL FIELD

The disclosure relates to the technical field of display, in particular to a display substrate, a method of forming a display substrate and a display device.

BACKGROUND

Organic light-emitting Diodes (OLEDs) are widely regarded as the most potential display and lighting technologies due to their unique advantages of low driving voltage signal, fast response speed, wide color gamut, self-luminescence, etc.

In general, for an OLED display device, the lighting voltages of three RGB colors, B (blue pixel) is the largest, and G (green pixel) and R (red pixel) are smaller. Because each transmission layer of the light-emitting device layer may have carrier migration, when a large voltage is applied to two ends of the blue organic light-emitting material, most current flows to the blue organic light-emitting material, and the blue pixel is lightened; but a small portion of the current flows to the green and red organic light-emitting materials to light up the green and red pixels, eventually resulting in low gray scale cross talk (crosstalk).

SUMMARY

A display substrate is provided in the present disclosure, including a plurality of pixel units arranged in an array, a substrate, a light-emitting device layer and an electrochromic functional layer, where the light-emitting device layer and the electrochromic functional layer are stacked on the substrate;
  the light-emitting device layer includes a plurality of light-emitting devices, the electrochromic functional layer includes a plurality of electrochromic functional devices, each pixel unit includes one light-emitting device and an effective light-emitting area, and at least one pixel unit includes one electrochromic functional device;
  an orthographic projection of the electrochromic functional device on the substrate is at least partially overlapped with an orthographic projection of the corresponding effective light-emitting area on the substrate;
  when the pixel units do not receive a driving voltage signal, the electrochromic functional device is configured to absorb light emitted by the corresponding pixel units under a control of an electric signal; or, under the control of the electric signal, a refraction of the light emitted by the corresponding pixel unit is increased; and
  when the pixel units receive the driving voltage signal, the electrochromic functional device is further configured to transmit the light emitted by the corresponding pixel units under the control of the electric signal.

Optionally, the electrochromic functional layer is located between the light-emitting device layer and the substrate; the light-emitting device layer includes an anode layer, a light-emitting layer and a cathode layer which are sequentially stacked along a direction away from the substrate;
  the electrochromic functional layer includes a first electrode layer, an electrochromic layer and a second electrode layer, and the first electrode layer, the electrochromic layer and the second electrode layer are sequentially stacked on the substrate along the direction away from the substrate;
  the second electrode layer is reused with the anode layer, and the anode layer is formed on a side, away from the substrate, of the electrochromic layer.

Optionally, the first electrode layer includes a plurality of first electrode structures and a plurality of second electrode structures; the substrate includes a driving circuit and a control circuit;
  the first electrode layer includes the first electrode structure and the second electrode structure which are independent of each other, corresponding to a single pixel unit;
  the first electrode structure is connected to a control circuit and configured to receive the electric signal output by the control circuit, and the second electrode structure is connected to the driving circuit and configured to receive the driving voltage signal output by the driving circuit;
  the electrochromic layer is positioned on a side of the first electrode structure away from the substrate, the anode layer includes a plurality of anodes, and the electrochromic layer includes a plurality of electrochromic structures;
  an orthographic projection of each electrochromic structure on the substrate is within an orthographic projection of the corresponding anode on the substrate, and the anode is electrically connected to the corresponding second electrode structure; and/or the anode is a transparent electrode.

Optionally, the electrochromic layer is configured to be in a transparent state under the control of the electrical signal received by the first electrode structure and the driving voltage signal received by the second electrode structure when the pixel units receive the driving voltage signal;
  when the pixel units do not receive the driving voltage signal, the electrochromic layer is configured to be in a light-shielding state under the control of the electric signal received by the first electrode structure and the driving voltage signal received by the second electrode structure.

Optionally, a material of the electrochromic layer includes at least one of ethylene oxide, tungsten oxide, or molybdenum oxide.

Optionally, the material of the electrochromic layer includes an electro-optic material;
  when a voltage value of the electric signal received by the first electrode structure is not equal to a voltage value of the driving voltage signal received by the second electrode structure, the electrochromic layer increases the refraction of light emitted by a target pixel.

Optionally, the display substrate further includes a planarization layer; the planarization layer is arranged on the first electrode structure, the second electrode structure and a side of the electrochromic layer away from the substrate;

the anode is electrically connected to the second electrode structure through a via that penetrates through the planarization layer.

Optionally, the electrochromic functional layer is located on a side of the light-emitting device layer away from the substrate;

the electrochromic functional layer includes a third electrode layer, an electrochromic layer and a fourth electrode layer which are sequentially stacked, where the third electrode layer is located on a side, facing the substrate, of the electrochromic layer.

Optionally, when the pixel units receive the driving voltage signal, the electrochromic layer is configured to be in a transparent state under the control of the electric signal received by the third electrode layer and the electric signal received by the fourth electrode layer;

when the pixel units do not receive the driving voltage signal, the electrochromic layer is configured to be in a light-shielding state under the control of the electric signal received by the third electrode layer and the electric signal received by the fourth electrode layer.

Optionally, the display substrate further includes an encapsulation layer; the encapsulation layer is positioned between the light-emitting device layer and the third electrode layer and covers the light-emitting device layer.

A display device is further provided in the present disclosure, including a display substrate;

where the display substrate includes a plurality of pixel units arranged in an array, a substrate, a light-emitting device layer and an electrochromic functional layer, where the light-emitting device layer and the electrochromic functional layer are stacked on the substrate;

the light-emitting device layer includes a plurality of light-emitting devices, the electrochromic functional layer includes a plurality of electrochromic functional devices, each pixel unit includes one light-emitting device and an effective light-emitting area, and at least one pixel unit includes one electrochromic functional device;

an orthographic projection of the electrochromic functional device on the substrate is at least partially overlapped with an orthographic projection of the corresponding effective light-emitting area on the substrate;

when the pixel units do not receive a driving voltage signal, the electrochromic functional device is configured to absorb light emitted by the corresponding pixel units under a control of an electric signal; or, under the control of the electric signal, a refraction of the light emitted by the corresponding pixel unit is increased; and when the pixel units receive the driving voltage signal, the electrochromic functional device is further configured to transmit the light emitted by the corresponding pixel units under the control of the electric signal.

Optionally, the electrochromic functional layer is located between the light-emitting device layer and the substrate; the light-emitting device layer includes an anode layer, a light-emitting layer and a cathode layer which are sequentially stacked along a direction away from the substrate;

the electrochromic functional layer includes a first electrode layer, an electrochromic layer and a second electrode layer, and the first electrode layer, the electrochromic layer and the second electrode layer are sequentially stacked on the substrate along the direction away from the substrate;

the second electrode layer is reused with the anode layer, and the anode layer is formed on a side, away from the substrate, of the electrochromic layer.

Optionally, the first electrode layer includes a plurality of first electrode structures and a plurality of second electrode structures; the substrate includes a driving circuit and a control circuit;

the first electrode layer includes the first electrode structure and the second electrode structure which are independent of each other, corresponding to a single pixel unit;

the first electrode structure is connected to a control circuit and configured to receive the electric signal output by the control circuit, and the second electrode structure is connected to the driving circuit and configured to receive the driving voltage signal output by the driving circuit;

the electrochromic layer is positioned on a side of the first electrode structure away from the substrate, the anode layer includes a plurality of anodes, and the electrochromic layer includes a plurality of electrochromic structures;

an orthographic projection of each electrochromic structure on the substrate is within an orthographic projection of the corresponding anode on the substrate, and the anode is electrically connected to the corresponding second electrode structure; and/or the anode is a transparent electrode.

Optionally, the electrochromic layer is configured to be in a transparent state under the control of the electrical signal received by the first electrode structure and the driving voltage signal received by the second electrode structure when the pixel units receive the driving voltage signal;

when the pixel units do not receive the driving voltage signal, the electrochromic layer is configured to be in a light-shielding state under the control of the electric signal received by the first electrode structure and the driving voltage signal received by the second electrode structure.

Optionally, a material of the electrochromic layer includes at least one of ethylene oxide, tungsten oxide, or molybdenum oxide.

Optionally, the material of the electrochromic layer includes an electro-optic material;

when a voltage value of the electric signal received by the first electrode structure is not equal to a voltage value of the driving voltage signal received by the second electrode structure, the electrochromic layer increases the refraction of light emitted by a target pixel.

Optionally, the display device further includes a planarization layer; the planarization layer is arranged on the first electrode structure, the second electrode structure and a side of the electrochromic layer away from the substrate;

the anode is electrically connected to the second electrode structure through a via that penetrates through the planarization layer.

A method for forming a display substrate is further provided in the present disclosure, including:

providing a substrate;

forming a light-emitting device layer and an electrochromic functional layer on the substrate; the light-emitting device layer includes a plurality of light-emitting devices and the electrochromic functional layer includes a plurality of electrochromic functional devices; each pixel unit includes one light-emitting device and an effective light-emitting area, and at least one pixel unit includes one electrochromic functional device; an orthographic projection of the electrochromic functional device on the substrate is at least partially overlapped with an orthographic projection of the corresponding effective light-emitting area on the substrate;

when the pixel units do not receive a driving voltage signal, the electrochromic functional device is configured to absorb light emitted by the corresponding pixel units under a control of an electric signal; or, under the control of the electric signal, a refraction of the light emitted by the corresponding pixel unit is increased; and when the pixel units receive the driving voltage signal, the electrochromic functional device is further configured to transmit the light emitted by the corresponding pixel units under the control of the electric signal.

Optionally, the forming the light-emitting device layer and the electrochromic functional layer on the substrate includes:

forming a first electrode layer on the substrate; the first electrode layer includes a first electrode structure and a second electrode structure corresponding to each pixel unit;

forming an electrochromic layer on a side of the first electrode structure away from the substrate;

forming a planarization layer to planarize the first electrode layer and the electrochromic layer;

forming a light-emitting device layer on a side of the planarization layer away from the substrate; the light-emitting device layer includes an anode layer, a light-emitting layer and a cathode layer which are sequentially stacked along a direction away from the substrate, the anode layer is formed on a side of the substrate away from the electrochromic layer, and the anode layer is connected to the second electrode structure through a via which penetrates through the planarization layer.

Optionally, the forming the light-emitting device layer and the electrochromic functional layer on the substrate includes:

forming a planarization layer on the substrate;

forming a light-emitting device layer on a side of the planarization layer away from the substrate;

sequentially forming a encapsulation layer and an electrochromic functional layer on a side of the light-emitting device layer away from the substrate; the electrochromic functional layer includes a third electrode layer, an electrochromic layer and a fourth electrode layer which are sequentially stacked along a direction away from the substrate, where the third electrode layer is located on a side of the encapsulation layer away from the substrate.

BRIEF DESCRIPTION OF THE DRAWINGS

The above and/or additional aspects and advantages of the present disclosure will become apparent and readily appreciated from the following description of the embodiments, taken in conjunction with the accompanying drawings of which.

DETAILED DESCRIPTION

Reference will now be made in detail to the present disclosure, examples of which are illustrated in the accompanying drawings, where like reference numerals refer to the same or similar elements or elements having the same or similar functions throughout. In addition, if a detailed description of known technologies is not necessary for illustrating the features of the present disclosure, it is omitted. The embodiments described below with reference to the accompanying drawings are illustrative only for the purpose of explaining the present disclosure, and are not to be construed as limiting the present disclosure.

It will be understood by those skilled in the art that, unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the singular forms "a", "an", "the" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes all or any element and all combinations of one or more of the associated listed items.

The following describes the technical solutions of the present disclosure and how to solve the above technical problems in detail with specific embodiments.

Figure 1:
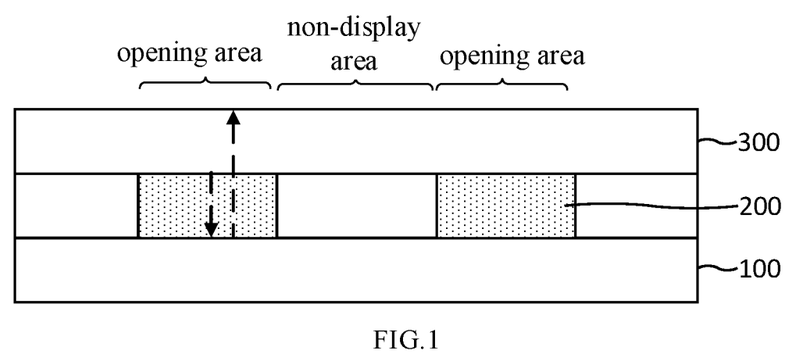
FIG. 1 is a schematic structural diagram of a display substrate according to an embodiment of the disclosure.
Figure 2:
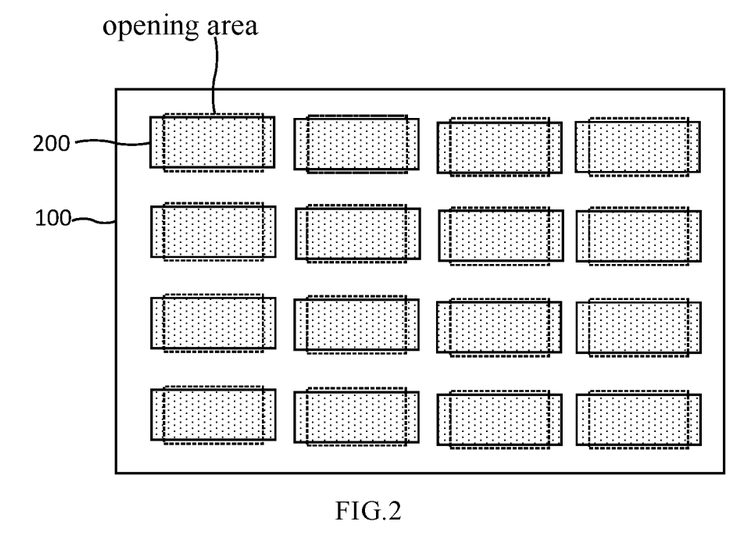
FIG. 2 is a schematic distribution diagram of an orthographic projection of an electrochromic functional layer of a display substrate on a substrate according to an embodiment of the disclosure.

As shown in FIG. 1 and FIG. 2, an embodiment of the present disclosure provides a display substrate including a plurality of pixel units arranged in an array, each pixel unit including an effective light-emitting area (i.e., an opening area in FIG. 1) and a non-display area. The display substrate further includes: a substrate 100, a light-emitting device layer 300 and an electrochromic functional layer 200 stacked on the substrate 100.

Specifically, the light-emitting device layer 300 includes a plurality of light-emitting devices, the electrochromic functional layer includes a plurality of electrochromic functional devices, each pixel unit includes one light-emitting device and one effective light-emitting region, and at least one pixel unit includes one electrochromic functional device. In the embodiments of the present disclosure, each pixel unit includes one electrochromic device as an example for illustration.

For convenience of description, the pixel unit which does not receive the driving voltage signal is named as a target pixel in the embodiment of the present disclosure, that is, the target pixel does not emit light by itself, but the target pixel receives a small portion of current of an adjacent normal light-emitting pixel to be lighted due to the existence of low gray-scale crosstalk. Meanwhile, the pixel unit receiving the driving voltage signal is named as a normal light-emitting pixel.

The orthographic projection of the electrochromic functional device on the substrate is at least partially overlapped with the orthographic projection of the corresponding effective light-emitting area on the substrate, so that the position of the electrochromic functional device corresponds to the position of the opening area, and the electrochromic functional layer 200 is configured to absorb light emitted by a target pixel due to current crosstalk of adjacent normal light-emitting pixels under the control of an electric signal, thereby avoiding the problem of uneven display caused by low-gray-scale crosstalk.

It is understood that in the embodiment of the present disclosure, normal light emission of the pixel unit is realized by the driving voltage signal, and the state change of the electrochromic functional layer 200 is realized by the electrical signal. In addition, the absorption of light emitted from the target pixel includes absorption of light directly emitted from the opening area by the light-emitting device, or includes absorption of light emitted from the light-emitting device layer 300 toward the substrate 100.

Optionally, the substrate 100 includes a base layer, a buffer layer, and a switching device layer formed on the buffer layer, and the switching device layer may be used to control a light-emitting state of each pixel unit.

The display substrate provided by the embodiment of the disclosure, by arranging the electrochromic functional layer 200 at a position corresponding to the opening area of the pixel unit, the electrochromic functional layer 200 can absorb light emitted by the target pixel under the control of an electric signal, because the target pixel is a pixel unit which does not receive a driving voltage signal in the embodiment of the disclosure, namely, the light emitted by the target pixel is light when crosstalk occurs, in this way, the light of crosstalk can be absorbed through the electrochromic functional layer 200, and further, the crosstalk light is controlled inside the device, the purpose of improving low gray scale crosstalk is achieved, and further, the display uniformity of the display panel is improved.

As another alternative, with continued reference to FIG. 1, the electrochromic functional layer 200 is further configured to increase refraction of the light emitted from the target pixel under the control of the electrical signal, so as to reduce the intensity of the light emitted from the target pixel.

In this embodiment, the state change of the electrochromic functional layer 200 is also realized by using an electrical signal. When the electrochromic functional layer 200 receives an electrical signal, the state of the electrochromic functional layer 200 changes (for example, the refractive index increases), so that the refraction of light emitted from the target pixel can be increased, the light actually emitted from the opening area is weakened, and the low gray scale crosstalk of the target pixel caused by the current crosstalk of the adjacent pixels is reduced as much as possible.

The display substrate provided by the embodiment, the electrochromic functional layer 200 is arranged at a position corresponding to the opening area of the pixel unit, the electrochromic functional layer 200 can increase the refraction of light emitted by a target pixel under the control of an electric signal, because the target pixel is a pixel unit which does not receive a driving voltage signal in the embodiment of the disclosure, namely, the light emitted by the target pixel are light when crosstalk occurs, in this way, the crosstalk light can be refracted through the electrochromic functional layer 200, the purpose of weakening low gray scale crosstalk is achieved, and therefore the display uniformity of the display panel is improved.

In some possible implementations, in order not to affect the normal light emission of the normal light-emitting pixels under the control of the driving voltage signal, the electrochromic functional layer 200 is further configured to transmit the light emitted by the normal light-emitting pixels under the control of the electrical signal.

Specifically, the electrochromic functional layer 200 can be switched to allow light emitted by the normal light-emitting pixels to pass through under the control of the electrical signal, so that the luminance of the normal light-emitting pixels is not affected, and meanwhile, the light emitted by the target pixels due to current crosstalk is absorbed or refracted, so that low-gray-scale crosstalk between adjacent pixel units can be avoided or weakened, and the display effect is further improved.

For example, the normal emitting pixel in the embodiment of the present disclosure may be a blue pixel unit, and the target pixel may be a green pixel unit or a red pixel unit.

Figure 3:
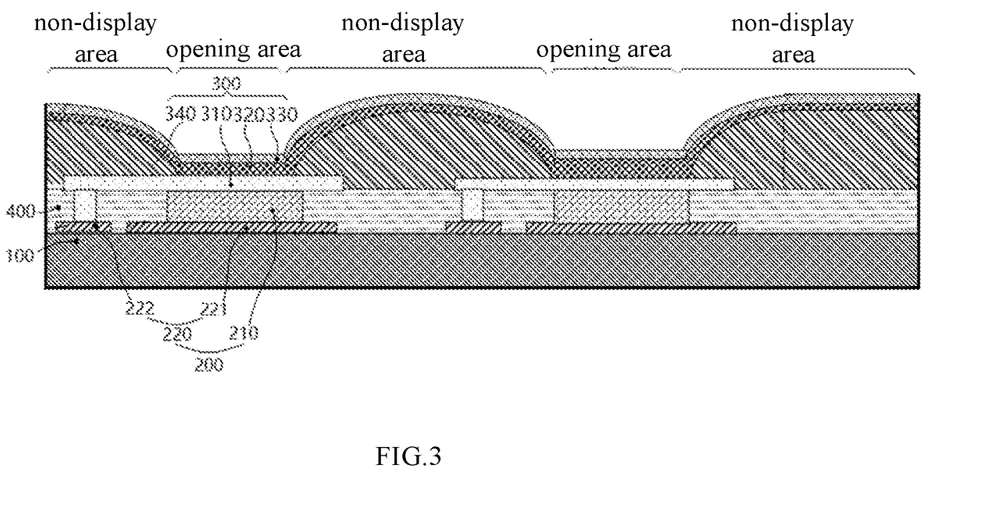
FIG. 3 is a schematic structural diagram of a display substrate according to an embodiment of the disclosure.

In some possible embodiments, as shown in FIG. 3, the electrochromic functional layer 200 is located between the light-emitting device layer 300 and the substrate 100, and the light-emitting device layer 300 includes an anode layer 310, a light-emitting layer 320, and a cathode layer 330, which are sequentially stacked in a direction away from the substrate 100. In addition, the light-emitting device layer 300 further includes a pixel defining layer 340, and for convenience of description, the light-emitting device layer 300 in the embodiment of the present disclosure refers to only the anode layer 310, the light-emitting layer 320, and the cathode layer 330, which are stacked.

The electrochromic functional layer 200 includes a first electrode layer 220, an electrochromic layer 210, and a second electrode layer (not shown), and the first electrode layer 220, the electrochromic layer 210, and the second electrode layer are sequentially stacked on the substrate 100 along a direction away from the substrate 100. In the embodiment of the present disclosure, the electrochromic functional layer 200 and the light-emitting device layer 300 form an optical microcavity, and the electrochromic layer 210 controls the light transmission state change of the electrochromic layer 210 under the action of the electrical signals received by the first electrode layer 220 and the second electrode layer, so as to absorb or weaken light emitted by a target pixel, achieve destruction or weakening of an optical microcavity effect, and avoid or reduce light emitted by the target pixel due to current crosstalk between adjacent pixels.

In order to reduce the difficulty of the process preparation, in the embodiment of the present disclosure, the second electrode layer is used to replace the anode layer 310, that is, the second electrode layer is replaced by the anode layer 310 in the light-emitting device layer 300, or it can also be understood that the anode layer 310 is replaced by the second electrode layer.

For ease of understanding, the anode layer 310, i.e., the complete structure of the light-emitting device layer 300 (the anode layer 310, the light-emitting layer 320, and the cathode layer 330) is retained in the embodiments of the present disclosure, and the anode layer 310 is used to replace the second electrode layer in the electro-functional layer for illustration. It is understood that the anode layer 310 formed on the side of the electrochromic layer 210 away from the substrate 100 may serve as both an electrode for the electrochromic layer 210 and a light-emitting layer 320.

Further, the anode layer 310 is configured to receive a predetermined driving voltage signal in combination with the second electrode layer of the electrochromic functional layer 200, that is, the anode layer 310 and the cathode layer 330 are both used for controlling the light-emitting layer 320 to emit light. For example, only when the anode layer 310 receives a driving voltage signal with positive polarity, and the cathode layer 330 receives a driving voltage signal with negative polarity, the corresponding pixel unit will normally emit light, and the pixel unit is considered to receive the driving voltage signal and is called as a normal emitting pixel; otherwise, when any one of the anode layer 310 and the cathode layer 330 does not receive a predetermined driving voltage signal, the pixel unit may be considered as a target pixel in the embodiment of the present disclosure.

In addition, the first electrode layer 220 receives an electrical signal, and the light transmission state change of the electrochromic layer 210 is controlled by a driving voltage signal of the anode layer 310 and the electrical signal of the first electrode layer 220.

In order not to affect the light emission of the normally emitting pixels, the anode layer 310 includes a plurality of anodes, and the anodes are transparent electrodes made of materials including, but not limited to, ITO (indium tin oxide). The transparent electrode does not affect the light-emitting effect, so that the part of light emitted by the normal light-emitting pixel towards the substrate 100 can be emitted from the opening region finally.

Optionally, the materials of the transparent electrodes of the pixel units of different colors may be the same or different, and may be specifically determined according to actual needs and process requirements.

Optionally, each of the first electrode layer 220 is a reflective electrode, and ITO, Ag (silver), and ITO may be sequentially stacked as a material of the reflective electrode, wherein the thickness of Ag is larger to enhance the reflection effect. The first electrode layer 220 in this embodiment is mainly used to prevent light loss caused by light entering the substrate 100, and an optical microcavity is formed by the first electrode layer 220, the electrochromic layer 210, the anode layer 310, the light-emitting layer 320, and the cathode layer 330, so that light emitted from a normal light-emitting pixel toward the substrate 100 can be reflected by the optical microcavity and finally emitted from the opening region.

In this embodiment, the electrochromic functional layer 200 is formed between the light-emitting device layer 300 and the substrate 100, so that the electrochromic layer 210 can destroy or weaken an optical microcavity effect formed by the electrochromic functional layer 200 and the light-emitting device layer 300, thereby absorbing or weakening light emitted by a target pixel towards the substrate 100, avoiding a low gray scale crosstalk problem between adjacent pixel units, and thus improving a display effect; the second electrode layer is reused with the anode layer 310, so that the preparation process can be simplified, the process efficiency can be improved, and the manufacturing cost of the display panel can be saved.

In some possible embodiments, with continued reference to FIG. 3, the first electrode layer 220 includes a plurality of first electrode structures 221 and a plurality of second electrode structures 222. To facilitate power supply for the anode layer 310 and the second electrode structure 222, corresponding driving circuits may be prepared in the substrate 100, where the driving circuits may be located in a switching device layer in the substrate 100, so as to achieve precise control over light emission of each pixel unit; in a specific implementation, a control circuit may be fabricated in the substrate 100 in advance to supply power to the first electrode structure 221, but the control circuit may not be fabricated in the substrate 100, and an external control circuit separately provided may be used to supply power to the first electrode structure 221.

The first electrode layer 220 includes a first electrode structure 221 and a second electrode structure 222 which are independent from each other, that is, there is no conduction between the first electrode structure 221 and the second electrode structure 222. The first electrode structure 221 is connected to the control circuit, and is configured to receive an electrical signal output by the control circuit; the second electrode structure 222 is connected to the driving circuit for receiving a driving voltage signal output by the driving circuit.

The electrochromic layer 210 is located at a side of the first electrode structure 221 away from the substrate 100, and includes a plurality of electrochromic structures corresponding to the open regions. For a single pixel unit, the orthographic projection of each electrochromic structure on the substrate is located inside the orthographic projection of the corresponding anode on the substrate, and the anode is electrically connected to the second electrode structure 222, so that the two sides of the electrochromic layer 210 respectively receive the electric signal of the first electrode structure 221 and the driving voltage signal of the second electrode structure 222.

Optionally, when the pixel unit receives the driving voltage signal, the electrochromic layer 210 is configured to be in a transparent state under the control of the electric signal received by the first electrode structure 221 and the driving voltage signal received by the second electrode structure 222 (corresponding to the anode layer 310), so that the light emitted from the normally-emitting pixel is not affected by the electrochromic layer 210.

Meanwhile, when the pixel unit does not receive a driving voltage signal, the electrochromic layer 210 is configured to be in a light-shielding state under the control of the electrical signal received by the first electrode structure 221 and the driving voltage signal received by the second electrode structure 222, that is, the electrochromic layer 210 destroys the original optical microcavity after being in the light-shielding state, so that the light cannot be emitted after being reflected by the optical microcavity and is absorbed by the electrochromic layer 210 in the light-shielding state, and thus the light of the target pixel, which is emitted toward the substrate 100 due to the current crosstalk, cannot be emitted from the open region after being reflected by the optical microcavity.

It should be noted that, for the target pixel, it may be set that the cathode layer 330 does not receive a preset driving voltage signal in this embodiment; alternatively, the driving voltage signals received by the anode layer 310 and the cathode layer 330 are not enough to excite the light-emitting layer 320 to emit light (e.g., the polarities of the driving voltage signals of the anode layer 310 and the cathode layer 330 are the same).

Optionally, when a voltage value corresponding to the electrical signal received by the first electrode structure 221 is not equal to a voltage value corresponding to the driving voltage signal received by the second electrode structure 222, the electrochromic layer 210 is in a light-shielding state; when the voltage value corresponding to the electrical signal received by the first electrode structure 221 is equal to the voltage value corresponding to the driving voltage signal received by the second electrode structure 222 (both polarity and magnitude are the same), the electrochromic layer 210 is in a transparent state.

For example, assuming that a certain pixel unit is turned on (taking the pixel unit on the left side in FIG. 3 as an example), the voltage value corresponding to the driving voltage signal received by the corresponding cathode layer 330 is -5V, the voltage value corresponding to the driving voltage signal received by the anode layer 310 (the second electrode structure 222) is +5V, and the voltage value corresponding to the electrical signal received by the first electrode structure 221 is +5V. At this time, the electrochromic layer 210 corresponding to the pixel unit is in a transparent state, and the light-emitting layer 320 is in a light-emitting state, so that the pixel unit emits light normally, which is a normal light-emitting pixel.

For example, assuming that a certain pixel unit does not light up (taking the pixel unit on the right side in FIG. 3 as an example), only the polarity of the driving voltage signal received by the anode layer 310 (the second electrode structure 222) needs to be changed based on the above example, and the voltage value of the anode layer 310 of the pixel unit is set to -5V, the voltage value of the cathode layer 330 is set to -5V, and the voltage value of the first electrode structure 221 is set to +5V. At this time, a voltage difference exists between two sides of the electrochromic layer 210 corresponding to the pixel unit, so that the pixel unit is in a light-shielding state, and meanwhile, a voltage difference does not exist between two sides of the light-emitting layer 320, so that the light-emitting layer 320 corresponding to the pixel unit does not emit light.

Optionally, the material of the electrochromic layer 210 includes at least one of inorganic electrochromic materials such as iridium oxide, tungsten oxide, or molybdenum oxide. In addition, the material can also be organic electrochromic material. The electrochromic materials for the pixel units of different colors may be the same or different, and may be specifically determined according to actual needs and process requirements.

In some possible embodiments, with continued reference to FIG. 3, in order to realize that the electrochromic functional layer 200 refracts light emitted from a target pixel under the control of an electrical signal, the material of the electrochromic layer 210 may be an electro-optical material. The electro-optical material is an optical functional material with an electro-optical effect, and the refractive index of the electro-optical material can be changed under the action of an external electric field.

Optionally, the electro-optic material in embodiments of the present disclosure may be a combination of one or more of potassium dihydrogen phosphate (DKDP), Ammonium Dihydrogen Phosphate (ADP), or a crystal of kojic acid rasp (LT).

Specifically, for the target pixel, when the voltage value of the electrical signal received by the first electrode structure 221 is not equal to the voltage value of the driving voltage signal received by the second electrode structure 222, the electrochromic layer 210 increases refraction of light emitted by the target pixel, so that an optical microcavity effect formed by the first electrode structure 221, the electrochromic layer 210, the anode layer 310, the light-emitting layer 320, and the cathode layer 330 is weakened, light emitted by the target pixel out of an opening region through the optical microcavity is reduced, and the problem of low gray-scale crosstalk of the display panel is reduced.

For example, assuming that a certain pixel unit is not lighted (taking the pixel unit on the right side in FIG. 3 as an example), the polarity of the driving voltage signal received by the anode layer 310 (the second electrode structure 222) needs to be changed only based on the above example, and the voltage value of the anode layer 310, the voltage value of the cathode layer 330 and the voltage value of the first electrode structure 221 of the pixel unit are set to be -5V, -5V and +5V, respectively. At this time, a voltage difference exists between two sides of the electrochromic layer 210 corresponding to the pixel unit, and the refractive index of the electrochromic layer 210 made of the electro-optic material is in a light-emitting state, so that light emitted from the opening area by the target pixel through the optical microcavity is reduced, and the problem of low gray scale crosstalk of adjacent pixel units is reduced.

In some possible embodiments, with continued reference to FIG. 3, a planarization layer 400 is further included between the substrate 100 and the light-emitting device layer 300 of the display substrate, in addition to the electrochromic functional layer 200, and the planarization layer 400 is disposed on the first electrode structure 221, the second electrode structure 222, and the electrochromic layer 210 on the side away from the substrate 100.

In order to facilitate the connection between the anode layer 310 and the second electrode structure 222, a via may be formed in a region of the planarization layer 400 corresponding to the second electrode structure 222, and the via is filled during the preparation of the anode layer 310, so that the anode layer 310 and the second electrode structure 222 are electrically connected.

Figure 4:
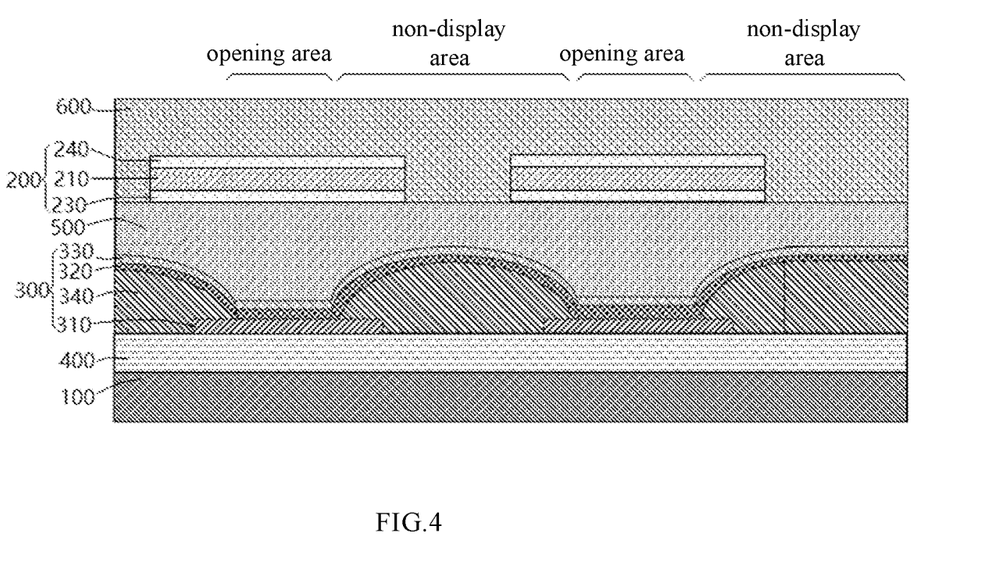
FIG. 4 is a schematic structural diagram of another display substrate provided in an embodiment of the disclosure.

In other possible embodiments, as shown in FIG. 4, the electrochromic functional layer 200 may also be located on the side of the light-emitting device layer 300 away from the substrate 100. The electrochromic functional layer 200 includes a third electrode layer 230, an electrochromic layer 210, and a fourth electrode layer 240, which are sequentially stacked, where the third electrode layer 230 is located on a side of the electrochromic layer 210 facing the substrate 100.

Further, in order not to affect the light output of the normal light-emitting pixel, the plurality of electrodes corresponding to the pixel unit included in the third electrode layer 230 and the fourth electrode layer 240 are all transparent electrodes, and the material of the transparent electrodes includes, but is not limited to, ITO.

In this embodiment, the electrochromic functional layer 200 is located above the light-emitting device layer 300, which is beneficial to process fabrication; and the third electrode layer 230 and the fourth electrode layer 240 are connected to an electrical signal, so that the switching of the light-transmitting state of the electrochromic layer 210 can be controlled, and thus the light emitted by the target pixel can be absorbed, and the light emitted by the normal light-emitting pixel can be transmitted.

Optionally, a planarization layer 400 is further included between the substrate 100 and the light-emitting device layer 300, and the planarization layer 400 may serve as an insulating layer between the light-emitting device layer 300 and the switching device layer while planarizing the switching device layer.

Optionally, when the pixel unit receives the driving voltage signal, the electrochromic layer 210 is configured to be in a transparent state under the control of the electrical signal received by the third electrode layer 230 and the electrical signal received by the fourth electrode layer 240, so that the light emitted by the normally-emitting pixel is not affected by the electrochromic layer 210.

Meanwhile, when the pixel unit does not receive a driving voltage signal, the electrochromic layer 210 is configured to be in a light-shielding state under the control of an electrical signal received by the third electrode layer 230 and an electrical signal received by the fourth electrode layer 240, so as to absorb light emitted by a target pixel due to current crosstalk between adjacent pixels, thereby solving the problem of low gray scale crosstalk and improving the display effect of the display panel.

Optionally, when the voltage value corresponding to the electrical signal received by the third electrode layer 230 is not equal to the voltage value corresponding to the electrical signal received by the fourth electrode layer 240, the electrochromic layer 210 is in a light-shielding state; when the voltage value corresponding to the electrical signal received by the third electrode layer 230 is equal to the voltage value corresponding to the electrical signal received by the fourth electrode layer 240 (both the polarity and the magnitude are the same), the electrochromic layer 210 is in a transparent state.

Optionally, the third electrode layer 230 and the fourth electrode layer 240 may both be led out through the via and connected to an external control circuit.

Optionally, with continued reference to FIG. 4, on the side of the electrochromic functional layer 200 away from the light-emitting device layer 300, further film layers are provided, such as: the touch layer 600. The touch layer 600 may cover the electrochromic functional layer 200.

In some possible embodiments, with continued reference to FIG. 4, for the case where the electrochromic layer 210 is located on the side of the light-emitting device layer 300 away from the substrate 100, the display substrate includes an encapsulation layer 500 in addition to the substrate 100, the planarization layer 400, and the light-emitting device layer 300.

Specifically, the encapsulation layer 500 is located between the light-emitting device layer 300 and the third electrode layer 230, and covers the light-emitting device layer 300, that is, the encapsulation layer 500 may play a role in protecting the substrate 100 and the light-emitting device layer 300, so that the structure of the light-emitting device layer 300 may not be affected by the preparation process of the electrochromic functional layer 200, and the structural design of the device is more flexible.

The embodiment of the present disclosure further provides a display device, which includes the display substrate in the embodiment of the present disclosure. The display device in the embodiment of the present disclosure includes a display panel, a television, a mobile phone, a tablet computer, and other devices.

The display device provided by the embodiment of the present disclosure includes the display substrate in the foregoing embodiment of the present disclosure, the electrochromic functional layer 200 is disposed at a position corresponding to an opening area of the pixel unit, a light-transmitting state of the electrochromic functional layer 200 can be changed under the control of an electrical signal, and the electrochromic functional layer 200 after the light-transmitting state is changed can absorb or refract light emitted by a target pixel, so as to avoid or reduce low gray scale crosstalk generated by the target pixel, and further improve display uniformity of the display panel.

Figure 5:
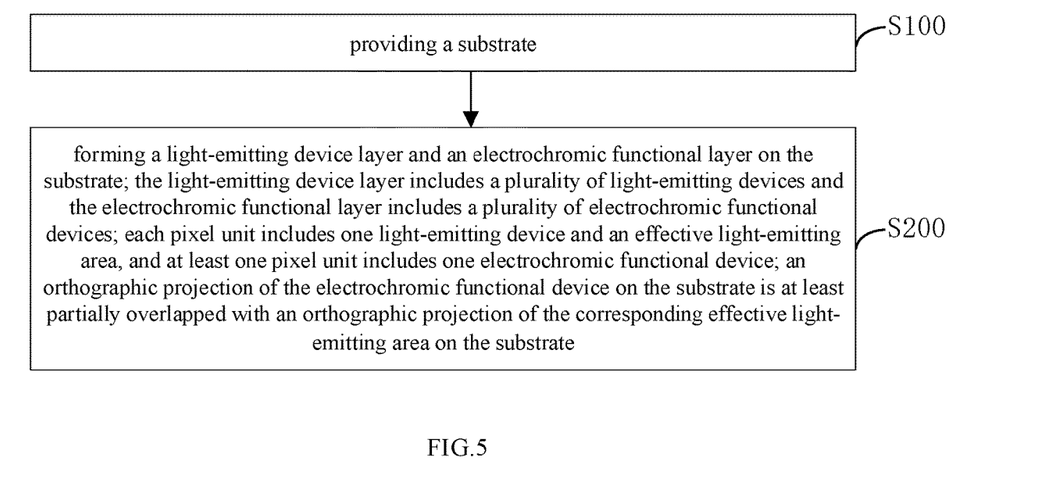
FIG. 5 is a flowchart of a method of forming a display substrate according to an embodiment of the disclosure.

Based on the same inventive concept, as shown in FIG. 5, an embodiment of the present disclosure further provides a method of forming a display substrate, including steps S100 and S200:

S100, providing a substrate.

Optionally, the substrate 100 serves as a carrier for the light-emitting device layer 300 and the functional device layer, and may specifically include a base layer, a buffer layer, and a switching device layer formed on the buffer layer, where the switching device layer may be used to control the light-emitting state of each pixel unit.

S200, forming a light-emitting device layer and an electrochromic functional layer on the substrate; the light-emitting device layer includes a plurality of light-emitting devices and the electrochromic functional layer includes a plurality of electrochromic functional devices; each pixel unit includes one light-emitting device and an effective light-emitting area, and at least one pixel unit includes one electrochromic functional device; an orthographic projection of the electrochromic functional device on the substrate is at least partially overlapped with an orthographic projection of the corresponding effective light-emitting area on the substrate.

Optionally, the electrochromic functional layer 200 may be first prepared at a position on the substrate 100 corresponding to the open region, and then the electroluminescent device layer 300 may be prepared according to the relative position between the electrochromic layer 210 and the light-emitting device layer 300. Of course, it is also possible to prepare the light-emitting device layer 300 on the substrate 100, and then prepare the electrochromic functional layer 200 on the light-emitting device layer 300 at a position corresponding to the opening area.

Further, the light-emitting device layer 300 includes a plurality of target pixels, which are pixel units that do not receive the driving voltage signal, i.e., do not emit light by themselves, but receive a small portion of current of an adjacent normal light-emitting pixel due to the low gray-scale crosstalk to be lit. The position of the electrochromic functional layer 200 corresponds to the position of the opening area, and the electrochromic functional layer 200 is configured to absorb or refract light emitted by a target pixel due to current crosstalk of an adjacent normal light-emitting pixel under the control of an electric signal, so that the problem of display unevenness caused by low-gray-scale crosstalk is avoided.

According to the method for forming the display substrate provided by the embodiment, the light-emitting device layer 300 and the electrochromic functional layer 200 are manufactured on the substrate 100, and since the light-transmitting state of the electrochromic functional layer 200 can be changed under the control of an electrical signal, the electrochromic functional layer 200 with the changed light-transmitting state can absorb or refract light emitted by a target pixel, so that low-gray-scale crosstalk between adjacent pixel units of the target pixel is avoided or reduced, and the display uniformity of the display panel is further improved.

Figure 6:
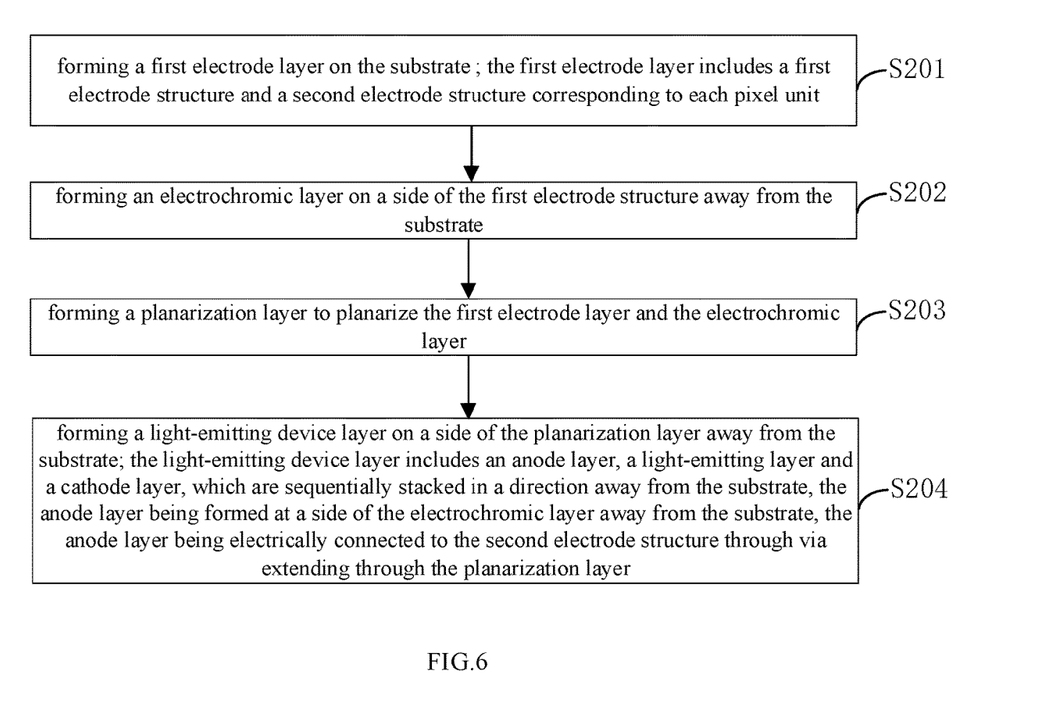
FIG. 6 is a flowchart illustrating a step S200 of a method of forming a display substrate according to an embodiment of the disclosure.

In some possible embodiments, as shown in FIG. 6, in the step S200, the light-emitting device layer 300 and the electrochromic functional layer 200 are prepared on the substrate 100, and the steps S201 to S204 are included:

S201, forming a first electrode layer 220 on the substrate 100; where the first electrode layer 220 includes a first electrode structure 221 and a second electrode structure 222 corresponding to each pixel unit.

Optionally, the first electrode structure 221 and the second electrode structure 222 in the first electrode layer 220 are independent of each other. The first electrode structure 221 and the second electrode structure 222 which are independent of each other, corresponding to a single pixel unit, may be obtained by patterning an entire film-forming electrode layer. The first electrode structure 221 is connected to the control circuit, and is configured to receive an electrical signal output by the control circuit; the second electrode structure 222 is connected to the driving circuit for receiving a driving voltage signal output by the driving circuit.

S202, forming an electrochromic layer 210 on a side of the first electrode structure 221 away from the substrate 100.

Optionally, the electrochromic layer 210 may be prepared by a general film forming process combined with a patterning process, or may be prepared directly on the first electrode structure 221 by using an inkjet printing process. The electrochromic layer 210 may change its light transmission state under the control of an electrical signal. The overall film forming process includes, but is not limited to, Physical Vapor Deposition (PVD), Chemical Vapor Deposition (CVD), or sputtering, and the specific process type may be selected according to the material and process requirements of the film layer.

Optionally, the material of the electrochromic layer 210 includes an inorganic electrochromic material such as an oxide, tungsten oxide, or molybdenum oxide, and may also be an organic electrochromic material. The electrochromic materials for the pixel units of different colors may be the same or different, and may be specifically determined according to actual needs and process requirements.

S203, forming a planarization layer 400 to planarize the first electrode layer 220 and the electrochromic layer 210.

Optionally, after the electrochromic layer 210 is fabricated, the planarization of the first electrode layer 220 and the electrochromic layer 210 is achieved by fabricating the planarization layer 400. The planarization layer 400 can be prepared by a full-scale film forming process, as long as the side of the planarization layer 400 away from the substrate 100 is flush with the side of the electrochromic layer 210 away from the substrate 100.

S204, forming a light-emitting device layer 300 on a side of the planarization layer 400 away from the substrate 100; the light-emitting device layer 300 includes an anode layer 310, a light-emitting layer 320 and a cathode layer 330, which are sequentially stacked in a direction away from the substrate 100, the anode layer 310 being formed at a side of the electrochromic layer 210 away from the substrate 100, the anode layer 310 being electrically connected to the second electrode structure 222 through via extending through the planarization layer 400.

Optionally, before the anode layer 310 is prepared, via need to be formed in the planarization layer 400, and the via are filled in the overall film-forming process of the anode layer 310, so as to achieve the electrical connection between the anode layer 310 and the second electrode structure 222. The anode layer 310 is then formed through a patterning process. After the anode layer 310 is fabricated, the pixel defining layer 340 may be fabricated, and then the light-emitting layer 320 and the cathode layer 330 may be fabricated through an evaporation process.

Figure 7:
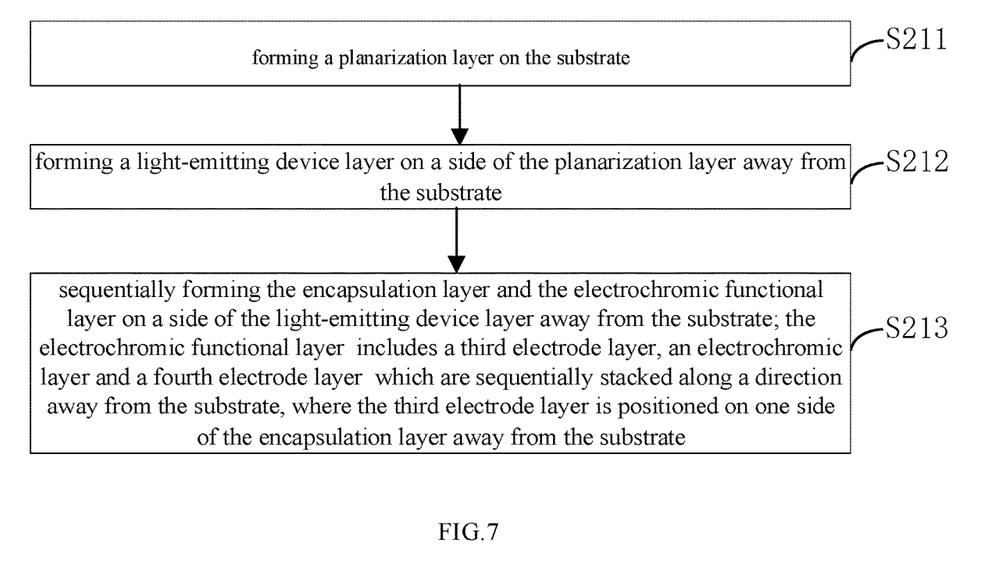
FIG. 7 is a flowchart illustrating a step S200 of another method of forming a display substrate according to an embodiment of the disclosure.

In some possible embodiments, as shown in FIG. 7, in the step S200, the light-emitting device layer 300 and the electrochromic functional layer 200 are prepared on the substrate 100, and the steps S211 to S213 are included:

S211, forming a planarization layer 400 on the substrate 100.

Optionally, the substrate 100 serves as a carrier for the light-emitting device layer 300 and the functional device layer, and may specifically include a base layer, a buffer layer, and a switching device layer formed on the buffer layer, where the switching device layer may be used to control the light-emitting state of each pixel unit. The planarization layer 400 may be formed on the switching device layer of the substrate 100 by a general film formation process.

S212, forming a light-emitting device layer 300 on a side of the planarization layer 400 away from the substrate 100.

Optionally, the light-emitting device layer 300 includes an anode layer 310, a light-emitting layer 320, and a cathode layer 330 stacked in sequence, the anode layer 310 being formed on a side of the planarization layer 400 away from the substrate 100. The anode layer 310 is formed through a patterning process. After the anode layer 310 is fabricated, the pixel defining layer 340 may be fabricated, and then the light-emitting layer 320 and the cathode layer 330 may be fabricated through an evaporation process.

S213, sequentially forming the encapsulation layer 500 and the electrochromic functional layer 200 on a side of the light-emitting device layer 300 away from the substrate 100; the electrochromic functional layer 200 includes a third electrode layer 230, an electrochromic layer 210 and a fourth electrode layer 240 which are sequentially stacked along a direction away from the substrate 100, where the third electrode layer 230 is positioned on one side of the encapsulation layer 500 away from the substrate 100.

Optionally, the encapsulation layer 500 is prepared on the side of the light-emitting device layer 300 away from the substrate 100 after the preparation of the light-emitting device layer 300 is completed. The electrochromic functional layer 200 is then prepared on the side of the encapsulation layer 500 away from the substrate 100. The electrochromic functional layer 200 includes a third electrode layer 230, an electrochromic layer 210, and a fourth electrode layer 240 that are stacked, where the third electrode layer 230 is located on a side of the encapsulation layer 500 away from the substrate 100, and the third electrode layer 230 and the fourth electrode layer 240 are connected to an electrical signal, so that switching of a light transmission state of the electrochromic layer 210 can be controlled, and thus light emitted by a target pixel can be absorbed, and light emitted by a normal light-emitting pixel can be transmitted.

Optionally, the third electrode layer 230 is first prepared on the encapsulation layer 500 at a position corresponding to the open region, then the electrochromic layer 210 is prepared on the third electrode layer 230, and finally the fourth electrode layer 240 is prepared on the electrochromic layer 210. The third electrode layer 230, the electrochromic layer 210, and the fourth electrode layer 240 may be patterned step by step, or the electrochromic functional layer 200 may be patterned after the fourth electrode layer 240 is completely prepared.

The embodiments of the disclosure have at least the following technical effects:

1. By arranging the electrochromic functional layer 200 at a position corresponding to the opening area of the pixel unit, the light transmission state of the electrochromic functional layer 200 can be changed under the control of an electric signal, and the electrochromic functional layer 200 with the changed light transmission state can absorb light emitted by a target pixel, thereby avoiding the target pixel from low gray scale crosstalk between adjacent pixel units and further improving the display uniformity of the display panel.

2. By arranging the electrochromic functional layer 200 at a position corresponding to the opening area of the pixel unit, the light transmission state of the electrochromic functional layer 200 can be changed under the control of an electric signal, and the electrochromic functional layer 200 with the changed light transmission state can refract light emitted by a target pixel, so that low gray scale crosstalk between adjacent pixel units of the target pixel is reduced, and the display uniformity of the display panel is improved.

3. By forming the electrochromic functional layer 200 between the light-emitting device layer 300 and the substrate 100, the electrochromic layer 210 can destroy or weaken the optical microcavity effect formed by the electrochromic functional layer 200 and the light-emitting device layer 300, so as to absorb or weaken light emitted by a target pixel towards the direction of the substrate 100, avoid the problem of low gray scale crosstalk between adjacent pixel units, and improve the display effect; the second electrode layer is reused with the anode layer 310, so that the preparation process can be simplified, the process efficiency can be improved, and the manufacturing cost of the display panel can be saved.

4. For the target pixel, the electrochromic layer 210 is configured to be in a light-shielding state under the control of the electric signal received by the first electrode structure 221 and the driving voltage signal received by the second electrode structure 222, that is, the electrochromic layer 210 destroys the original optical microcavity after being in the light-shielding state, so that the light cannot be emitted after being reflected by the optical microcavity and is absorbed by the electrochromic layer 210 in the light-shielding state, and thus the light emitted by the target pixel toward the substrate 100 due to the current crosstalk cannot be emitted from the open region after being reflected by the optical microcavity.

5. For the target pixel, when the voltage value of the electrical signal received by the first electrode structure 221 is not equal to the voltage value of the driving voltage signal received by the second electrode structure 222, the electrochromic layer 210 refracts light emitted by the target pixel, so that an optical microcavity effect formed by the first electrode structure 221, the electrochromic layer 210, the anode layer 310, the light-emitting layer 320, and the cathode layer 330 is reduced, light emitted from the target pixel through the optical microcavity to the open area is reduced, and the problem of low gray-scale crosstalk of the display panel is reduced.

6. The electrochromic functional layer 200 is positioned on the light-emitting device layer 300, so that the process manufacturing is facilitated; and the switching of the light transmission state of the electrochromic layer 210 can be controlled by connecting the third electrode layer and the fourth electrode layer with an electric signal, so that the light emitted by the target pixel can be absorbed, and the light emitted by the normal light-emitting pixel can be transmitted.

7. For the target pixel, the electrochromic layer 210 is configured to be in a light-shielding state under the control of the electric signal received by the third electrode layer and the electric signal received by the fourth electrode layer, so as to absorb the light emitted by the target pixel due to the current crosstalk of the adjacent pixel, thereby solving the problem of low gray scale crosstalk and improving the display effect of the display panel.

In the description of the present disclosure, it is to be understood that the terms "center", "upper", "lower", "front", "rear", "left", "right", "vertical", "horizontal", "top", "bottom", "inner", "outer", and the like indicate orientations or positional relationships based on those shown in the drawings, merely for convenience in describing the present disclosure and simplifying the description, and do not indicate or imply that the device or element referred to must have a particular orientation, be constructed in a particular orientation, and be operated, and therefore, should not be construed as limiting the present disclosure.

The terms "first", "second" and "first" are used for descriptive purposes only and are not to be construed as indicating or implying relative importance or to implicitly indicate the number of technical features indicated. Thus, a feature defined as "first" or "second" may explicitly or implicitly include one or more of that feature. In the description of the present disclosure, the meaning of "a plurality" is two or more unless otherwise specified.

In the description of the present disclosure, it should be noted that, unless otherwise explicitly stated or limited, the terms "mounted," "connected," and "connected" are to be construed broadly, e.g., as being fixedly connected, detachably connected, or integrally connected; they may be connected directly or indirectly through intervening media, or they may be interconnected between two elements. The specific meaning of the above terms in the present disclosure can be understood in a specific case to those of ordinary skill in the art.

The particular features, structures, materials, or characteristics may be combined in any suitable manner in any one or more embodiments or examples.

The foregoing is illustrative of only some embodiments of the disclosure, and it will be appreciated by those skilled in the art that various modifications and adaptations can be made without departing from the principles of the disclosure, and are intended to be within the scope of the disclosure.

What is claimed is:

1. A display substrate, comprising a plurality of pixel units arranged in an array, a substrate, a light-emitting device layer and an electrochromic functional layer, wherein the light-emitting device layer and the electrochromic functional layer are stacked on the substrate;

the light-emitting device layer comprises a plurality of light-emitting devices, the electrochromic functional layer comprises a plurality of electrochromic functional devices, each pixel unit comprises one light-emitting device and an effective light-emitting area, and at least one pixel unit comprises one electrochromic functional device;

an orthographic projection of the electrochromic functional device on the substrate is at least partially overlapped with an orthographic projection of the corresponding effective light-emitting area on the substrate;

when one pixel unit does not receive a driving voltage signal and is driven by a portion of current of an adjacent pixel unit that receives the driving voltage signal, to emit light, the electrochromic functional device corresponding to the one pixel unit is configured to, under control of an electric signal, absorb the light emitted by the one pixel unit; or, the electrochromic functional device corresponding to the one pixel unit is configured to, under the control of the electric signal, increase a refraction of the light emitted by the one pixel unit; and when the one pixel unit receives the driving voltage signal, the electrochromic functional device corresponding to the one pixel unit is further configured to, under control of the electric signal, transmit light emitted by the one pixel unit;

the light-emitting device layer comprises an anode layer, a light-emitting layer and a cathode layer which are sequentially stacked along a direction away from the substrate;

the electrochromic functional layer comprises a first electrode layer, an electrochromic layer and a second electrode layer, and the first electrode layer, the electrochromic layer and the second electrode layer are sequentially stacked on the substrate along the direction away from the substrate;

the second electrode layer is reused with the anode layer, and the anode layer is formed on a side, away from the substrate, of the electrochromic layer.

2. The display substrate according to claim 1, wherein the electrochromic functional layer is located between the light-emitting device layer and the substrate.

3. The display substrate according to claim 2, wherein the first electrode layer comprises a plurality of first electrode structures and a plurality of second electrode structures; the substrate comprises a driving circuit and a control circuit;

the first electrode layer in a single pixel unit comprises a first electrode structure of the plurality of first electrode structures and a second electrode structure of the plurality of second electrode structures; the first electrode structure of the plurality of first electrode structures and the second electrode structure of the plurality of second electrode structures in the single pixel unit are independent of each other;

the first electrode structure is connected to the control circuit and configured to receive an electric signal output by the control circuit, and the second electrode structure is connected to the driving circuit and configured to receive a driving voltage signal output by the driving circuit;

the electrochromic layer is positioned on a side of the first electrode structure away from the substrate, the anode layer comprises a plurality of anodes, and the electrochromic layer comprises a plurality of electrochromic structures;

an orthographic projection of each electrochromic structure on the substrate is within an orthographic projection of the corresponding anode on the substrate, and the anode is electrically connected to the corresponding second electrode structure; and/or the anode is a transparent electrode.

4. The display substrate according to claim 3, wherein when the one pixel unit receives the driving voltage signal output by the driving circuit, the electrochromic layer is configured to be in a transparent state, under control of the electrical signal output by the control circuit and received by the first electrode structure and the driving voltage signal output by the driving circuit and received by the second electrode structure;

when the one pixel unit does not receive the driving voltage signal output by the driving circuit, the electrochromic layer is configured to be in a light-shielding state, under the control of the electric signal output by the control circuit and received by the first electrode structure and the driving voltage signal output by the driving circuit and received by the second electrode structure.

5. The display substrate according to claim 4, wherein a material of the electrochromic layer comprises at least one of ethylene oxide, tungsten oxide, or molybdenum oxide.

6. The display substrate according to claim 3, wherein the material of the electrochromic layer comprises an electro-optic material;

when a voltage value of the electric signal received by the first electrode structure is not equal to a voltage value of the driving voltage signal received by the second electrode structure, the electrochromic layer increases the refraction of light emitted by the one pixel.

7. The display substrate according to claim 3, further comprising a planarization layer; the planarization layer is arranged on the first electrode structure, the second electrode structure and a side of the electrochromic layer away from the substrate;

the anode is electrically connected to the second electrode structure through a via that penetrates through the planarization layer.

8. A display device, comprising a display substrate;

wherein the display substrate comprises a plurality of pixel units arranged in an array, a substrate, a light-emitting device layer and an electrochromic functional layer, wherein the light-emitting device layer and the electrochromic functional layer are stacked on the substrate;

the light-emitting device layer comprises a plurality of light-emitting devices, the electrochromic functional layer comprises a plurality of electrochromic functional devices, each pixel unit comprises one light-emitting device and an effective light-emitting area, and at least one pixel unit comprises one electrochromic functional device;

an orthographic projection of the electrochromic functional device on the substrate is at least partially overlapped with an orthographic projection of the corresponding effective light-emitting area on the substrate;

when one pixel unit does not receive a driving voltage signal and is driven by a portion of current of an adjacent pixel unit that receives the driving voltage signal, to emit light, the electrochromic functional device corresponding to the one pixel unit is configured to, under control of an electric signal, absorb light emitted by the one pixel unit; or, the electrochromic functional device corresponding to the one pixel unit is configured to, under the control of the electric signal, increase a refraction of the light emitted by the one pixel unit; and when the one pixel unit receives the driving voltage signal, the electrochromic functional device corresponding to the one pixel unit is further configured to, under control of the electric signal, transmit light emitted by the one pixel unit;

the light-emitting device layer comprises an anode layer, a light-emitting layer and a cathode layer which are sequentially stacked along a direction away from the substrate;

the electrochromic functional layer comprises a first electrode layer, an electrochromic layer and a second electrode layer, and the first electrode layer, the electrochromic layer and the second electrode layer are sequentially stacked on the substrate along the direction away from the substrate;

the second electrode layer is reused with the anode layer, and the anode layer is formed on a side, away from the substrate, of the electrochromic layer.

9. The display device according to claim 8, wherein the electrochromic functional layer is located between the light-emitting device layer and the substrate.

10. The display device according to claim 9, wherein the first electrode layer comprises a plurality of first electrode structures and a plurality of second electrode structures; the substrate comprises a driving circuit and a control circuit;
the first electrode layer in a single pixel unit comprises a first electrode structure of the plurality of first electrode structures and a second electrode structure of the plurality of second electrode structures; the first electrode structure of the plurality of first electrode structures and the second electrode structure of the plurality of second electrode structures in the single pixel unit are independent of each other;
the first electrode structure is connected to the control circuit and configured to receive an electric signal output by the control circuit, and the second electrode structure is connected to the driving circuit and configured to receive a driving voltage signal output by the driving circuit;
the electrochromic layer is positioned on a side of the first electrode structure away from the substrate, the anode layer comprises a plurality of anodes, and the electrochromic layer comprises a plurality of electrochromic structures;
an orthographic projection of each electrochromic structure on the substrate is within an orthographic projection of the corresponding anode on the substrate, and the anode is electrically connected to the corresponding second electrode structure; and/or the anode is a transparent electrode.

11. The display device according to claim 10, wherein when the one pixel unit receives the driving voltage signal output by the driving circuit, the electrochromic layer is configured to be in a transparent state, under control of the electrical signal output by the control circuit and received by the first electrode structure and the driving voltage signal output by the driving circuit and received by the second electrode structure;
when the one pixel unit does not receive the driving voltage signal output by the driving circuit, the electrochromic layer is configured to be in a light-shielding state, under the control of the electric signal output by the control circuit and received by the first electrode structure and the driving voltage signal output by the driving circuit and received by the second electrode structure.

12. The display device according to claim 11, wherein a material of the electrochromic layer comprises at least one of ethylene oxide, tungsten oxide, or molybdenum oxide.

13. The display device according to claim 10, wherein the material of the electrochromic layer comprises an electro-optic material;
when a voltage value of the electric signal received by the first electrode structure is not equal to a voltage value of the driving voltage signal received by the second electrode structure, the electrochromic layer increases the refraction of light emitted by the one pixel.

14. The display device according to claim 10, further comprising a planarization layer; the planarization layer is arranged on the first electrode structure, the second electrode structure and a side of the electrochromic layer away from the substrate;
the anode is electrically connected to the second electrode structure through a via that penetrates through the planarization layer.

15. A method for forming a display substrate, comprising:
providing a substrate;
forming a light-emitting device layer and an electrochromic functional layer on the substrate; the light-emitting device layer comprises a plurality of light-emitting devices and the electrochromic functional layer comprises a plurality of electrochromic functional devices; each pixel unit comprises one light-emitting device and an effective light-emitting area, and at least one pixel unit comprises one electrochromic functional device; an orthographic projection of the electrochromic functional device on the substrate is at least partially overlapped with an orthographic projection of the corresponding effective light-emitting area on the substrate;
when one pixel unit does not receive a driving voltage signal and is driven by a portion of current of an adjacent pixel unit that receives the driving voltage signal, to emit light, the electrochromic functional device corresponding to the one pixel unit is configured to, under control of an electric signal, absorb the light emitted by the one pixel unit; or, the electrochromic functional device corresponding to the one pixel unit is configured to, under the control of the electric signal, increase a refraction of the light emitted by the one pixel unit; and
when the one pixel unit receives the driving voltage signal, the electrochromic functional device corresponding to the one pixel unit is further configured to, under control of the electric signal, transmit light emitted by the one pixel unit;
wherein the forming the light-emitting device layer and the electrochromic functional layer on the substrate comprises:
forming a first electrode layer on the substrate; the first electrode layer comprises a first electrode structure and a second electrode structure corresponding to each pixel unit;
forming an electrochromic layer on a side of the first electrode structure away from the substrate;
forming a planarization layer to planarize the first electrode layer and the electrochromic layer;
forming a light-emitting device layer on a side of the planarization layer away from the substrate; the light-emitting device layer comprises an anode layer, a light-emitting layer and a cathode layer which are sequentially stacked along a direction away from the substrate, the anode layer is formed on a side of the electrochromic layer away from the substrate, and the anode layer is connected to the second electrode structure through a via which penetrates through the planarization layer.

* * * * *